United States Patent [19]

Debaigt

[11] 3,833,839

[45] Sept. 3, 1974

[54] TERMINAL BOX CONTAINING A PRINTED CIRCUIT CARD

[75] Inventor: Jean Debaigt, Maisons Laffitte, France

[73] Assignee: CGEE Alsthom, Levallois-Perret, France

[22] Filed: Jan. 22, 1973

[21] Appl. No.: 325,796

[30] Foreign Application Priority Data

Jan. 21, 1972 France ............................... 72.2084

[52] U.S. Cl........ 317/118, 317/101 DH, 339/198 G, 339/17 N

[51] Int. Cl. ............................................ H05k 7/14

[58] Field of Search...............317/101 R, 101 CB, 317/101 D, 101 CC, 101 DH, 117, 118, 120; 339/198, 17 LC, 17 N

[56] References Cited

UNITED STATES PATENTS

| | | | |
|---|---|---|---|
| 2,855,454 | 10/1958 | Alden | 317/101 CB |
| 3,259,876 | 7/1966 | Norden | 339/198 R |
| 3,443,162 | 5/1969 | Nudelmont | 317/118 |
| 3,599,046 | 8/1971 | Spreitzer | 317/101 R |
| 3,601,661 | 8/1971 | Kleinhample, Jr. | 317/120 |
| 3,631,299 | 12/1971 | Meyer | 317/101 DH |
| 3,710,194 | 1/1973 | Zammit | 317/101 R |
| 3,710,197 | 1/1973 | Olds | 317/118 |
| 3,714,515 | 1/1973 | Lee | 317/118 |

FOREIGN PATENTS OR APPLICATIONS

| | | | |
|---|---|---|---|
| 897,999 | 6/1962 | Great Britain | 317/101 DH |

*Primary Examiner*—Robert K. Schaefer
*Assistant Examiner*—Gerald P. Tolin
*Attorney, Agent, or Firm*—Sughrue, Rothwell, Mion, Zinn & Macpeak

[57] ABSTRACT

Terminal box containing a printed circuit card, characterized more particularly in that it comprises, moreover, electrical connection terminals forming, with the printed circuit card, a single-piece block, and a body in the form of a plate which is placed transversely and standing on its narrowest edge on a support such as a profiled ledge, one of whose sides has a hollowed part for accommodating the block formed by the terminals and the printed circuit card.

10 Claims, 5 Drawing Figures

TERMINAL BOX CONTAINING A PRINTED CIRCUIT CARD

Figures 1, 2:
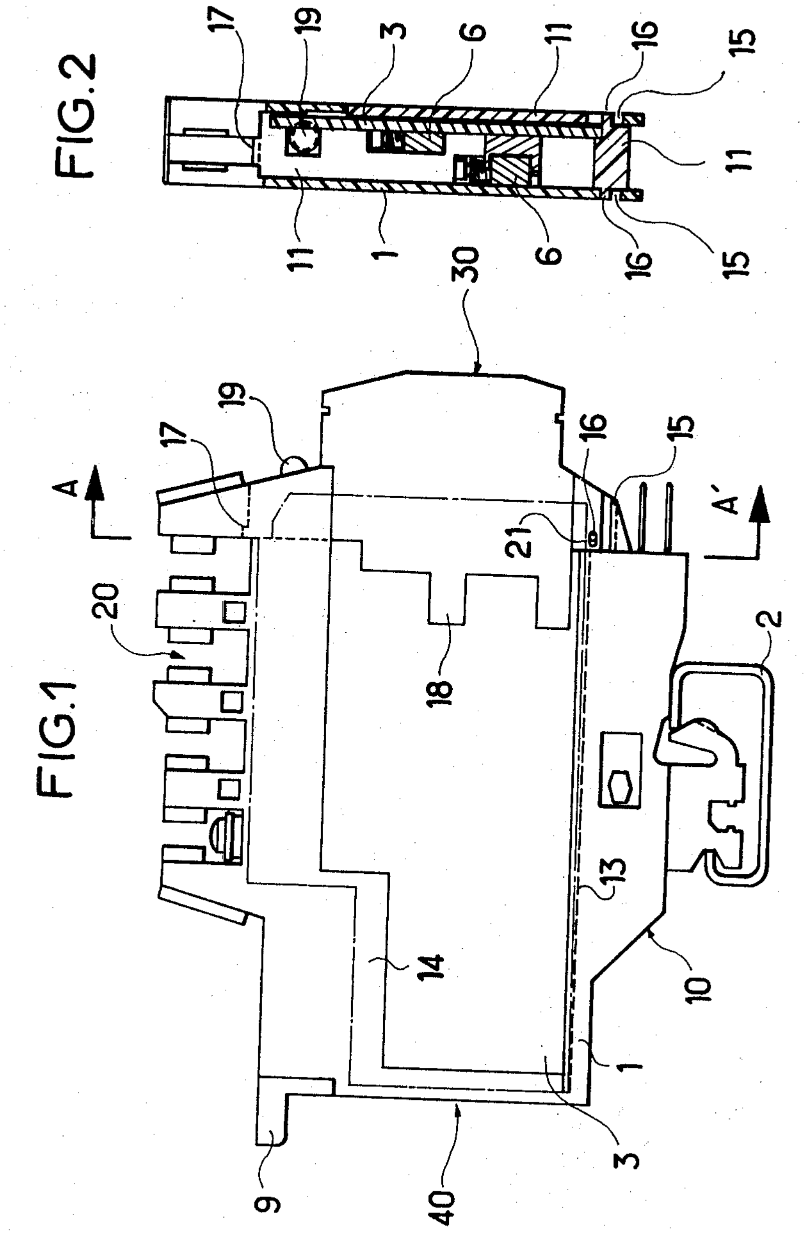

The invention concerns the wiring and the lay of the electrical and electronic circuits in a device.

The circuits of a device are generally wired on printed circuit cards arranged side by side on special connectors by means of which they are connected to the general terminal unit of the device.

The aim of the invention is to simplify the wiring of a device and to make it more reliable by dispensing with the electric junction by the use of connectors which act as supports for the printed circuit cards. Its aim is also to simplify the design of the frame of a device by avoiding the obligation to provide, on the latter, supports other than those necessary for the general terminal unit.

The object of the invention is a set of terminal boxes which may be stacked side by side on a support such as a profiled ledge which may act as a housing and as a connector for electrical arrangements wired on printed circuit cards.

The terminal boxes according to the invention are characterised in that they all comprise: a printed circuit card on which is wired an electrical arrangement, a set of connection terminals which are arranged on the periphery of the printed circuit card and which form, with the latter, a single-piece block, and a body in the form of a plate which is placed transversally and standing on its narrowest edge on a support, such as a profiled ledge, one of whose sides has a hollowed part for accomodating the block formed by the terminals and the printed circuit card, the printed circuit card being placed in its housing, parallel to the sides of the said body, and the terminal connections being accessible from the outside by the bulk of the latter.

According to a variant of the invention, the body of the terminal boxes comprises a mobile portion, which separates one of the outside faces of its bulk from the housing of the printed circuit card which may be moved away to enable the withdrawal, by the said face, of the block formed by the printed circuit card and the terminals, these latter having previously been disconnected.

Other characteristics and advantages of the invention will become apparent from the following description of an embodiment, given by way of an example. That description will be given with reference to the drawing, in which FIGS. 1 to 5 are views of a terminal box according to the invention, FIG. 1 being an elevation view, FIG. 2 being a cross-sectional view through line A A′ in FIG. 1, FIG. 3 being an elevation cross-sectional view, FIG. 4 being a top view and FIG. 5 being a cross-sectional view through line B B′ in FIG. 3.

The terminal box shown in the figures makes it possible to form, by stacking with other terminal boxes, terminal units having more or less large dimensions, containing electrical arrangements wired on printed circuit cards. It comprises a printed circuit card 3 on which may be wired an electrical arrangement, a set of connection terminals which are arranged on the periphery of the printed circuit card 3 and which form, with the latter, a single-piece block, and a body 1 in the form of a plate which is placed transversally and standing on it narrowest edge on a profiled ledge 2, one of whose sides has a hollowed part for accomodating the block formed by the terminals and the printed circuit card 3. The printed circuit card 3 is arranged in its housing, parallel to the sides of the body 1, which comprises, on its bulk, openings making it possible to reach the connection terminals from the outside.

The body 1 comprises a mobile portion 11, separating the lateral front face 30 of its bulk from the housing of the printed circuit card 3. The latter may be moved away and enables the withdrawal of the block formed by the printed circuit card 3 and the terminals from the body 1 of a terminal box by the said face 30 even when the terminal box forms a part of a stack.

Figure 3:
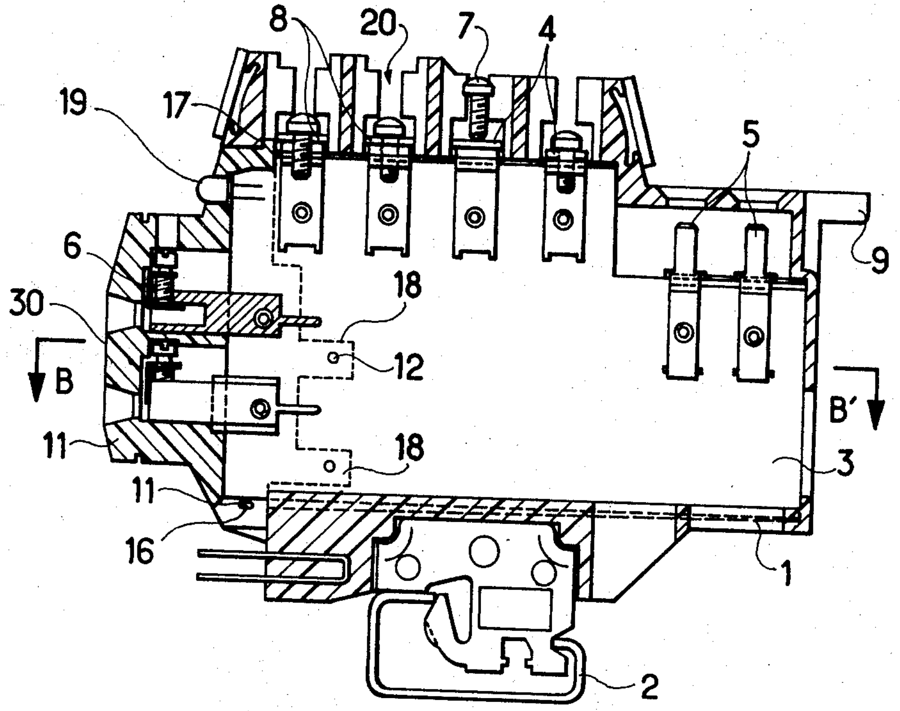
Figure 4:
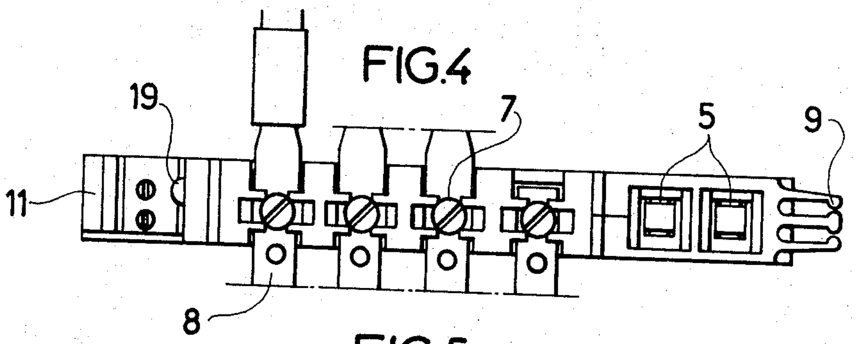
Figure 5:
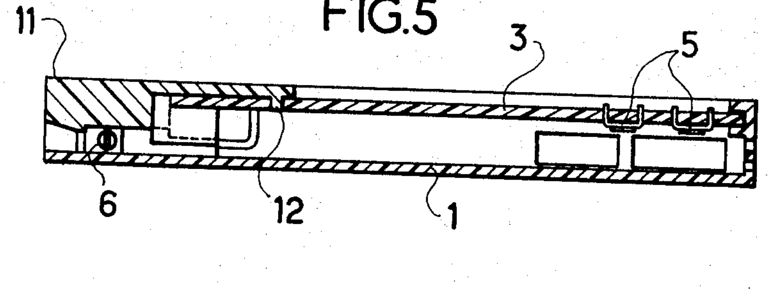

The electrical connection terminals of the terminal box may be seen as a whole in FIG. 3. First, second and third terminals 4, 5 and 6 may be distinguished among these latter.

The first terminals 4 are arranged in a row on one of the edges of the printed circuit card 3 and may be reached from the outside by the upper face 20 of the bulk of the body 1. In a stack formed by terminal boxes such as that described, the first terminals 4 of the same order in the row are alined and may be connected together by means of a shunt strip 8 in the same direction as the stacking. These first terminals 4 make it possible to effect connections between the arrangement wired on the printed circuit card 3 and common circuits such as earth lines or supply lines. They are four in number in the terminal box described. Each of them is constituted by a metal tab folded square, one of whose branches is fixed to the edge of the printed circuit card 3, the other branch, which is flush with the said edge, having a tapped hole in which a screw 7, ensuring the fixing of the shunt strip 8 is adjustable. That shunt strip 8 is formed by a flat metal strip provided, at regular intervals, with holes in which the screw 7 may be inserted.

The second terminals 5 are arranged in a row in sequence with the first terminals 4. Like the first terminals 4, these second terminals 5 be reached from the outside by the upper face 20 of the bulk of the body 1 of the terminal box. They make it possible to ensure interconnections between electrical arrangements wired on printed circuit cards 3 belonging to distinct terminals boxes forming a stack. They are two in number and are formed by double clip pins.

The third terminals 6 are arranged on another edge of the printed circuit card 3, that edge being turned towards the lateral face 30 of the bulk of the body 1. These latter are provided for the connections of the arrangement wired on the printed circuit card 3 with conductors coming from the outside, without requiring any special preparation of the end of these latter. They are two in number and are formed, in the example described, by terminals tightened by screws, of known type. The body 1 of the terminal box shown in the figures is in the shape of a plate whose outline is substantially rectangular. Its bulk has a lower face 10 which is the one to be placed facing the profiled ledge 2, an upper face 20 which is the opposite one to the preceding face, as well as a front face 30 and a rear face 40 which are its two lateral faces. Its upper face 20 comprises openings for access to the first and second terminals 4 and 5. Its front face 30 comprises the openings for access to the third terminals 6. It is provided on its edge separating its upper face 20 from its rear face 40, with extensions 9 in the shape of saw teeth, having a direction parallel to its upper face 20, which form, in a stack of terminal boxes analogous to that described, the teeth of a spinning comb, the rear faces 40 of terminals boxes forming the well of a spout in which are arranged the conductors ensuring interconnections between the arrangements wired on the printed circuit cards 3 housed in the terminal boxes.

The mobile portion 11 separates the housing of the printed circuit card 3 from the front face 30 of the body 1. It fits into the third terminals 6 and one of the edges of the printed circuit card 3. It is fixed to the printed circuit card 3 by means of studs 12 which may be seen in FIGS. 3 and 5, on tabs 18 which extend parallel to the printed circuit card 3.

The printed circuit card 3 is held in place in the body 1 of the terminal box first terminals 4 which are normally fixed to the shunt strips 8 by the screws 7. When the connection terminals 4, 5, 6 which are fast therewith are disconnected, it is held in place temporarily in the body 1 of the terminal box by means of the mobile portion 11 which may be fixed to the remainder of the body 1, on the one hand, by means of lugs 16 which may be seen in FIG. 2, which are arranged at its base, which co-operate with grooves 15 formed in the body 1 and which lock at the end of travel into openings 21 having a deformable contour, formed in the upper wall of the grooves 15, and on the other hand, by means of a nipple 17 arranged at the top of the mobile portion 11 which, at the instant when the lugs 16 lock, fits into a hollowed portion provided at the upper part of the body 1. The guiding of the printed circuit card 3 in the direction of the front face 30 is ensured by slides 13 and 14.

The withdrawal of a printed circuit card 3 from a terminal box belonging to a stack is very easy. For that purpose, it is necessary to disconnect all the connection terminals 4, 5, 6 which are fast therewith, to press down on the mobile portion 11 which is fast therewith to clear the nipple 17 and the lugs 16, then to pull on the latter portion.

The removable portion 11 is shown in detail in the figures. Its profile is drawn in continuous and discontinuous lines in FIGS. 1 and 3, whereas that of the printed circuit cards 3 is drawn in partly continuous and partly discontinuous lines.

The terminal bow described also comprises a warning light 19 fixed to the printed circuit card 3 which may be seen from the outside by the front face 30 of the body 1. That warning light 19 makes it possible to check the operation of the arrangement wired on the printed circuit card 3. It may be replaced by a switch or a test plug which may be reached from the front face 30.

The sides of the body 1 may be provided with a system of lock-in nipples which give the possibility of preassembling, in the form of a block, a certain number of terminal boxes before placing them on the profiled ledge 2.

The body 1 of the terminal box shown in the figures is provided on its lower face 10 with a removable and interchangeable fixing leg. It is fixed simply by exchanging the leg on support ledges having very different profiles. It is made of a moulded insulating substance. It comprises, if necessary, an electromagnetic armouring formed by conductive screens made, for example, by metallising a part of its surface and by connecting it up to the earth.

The invention is not limited to the example described. Without going beyond the scope thereof, certain arrangements such as the shape of the body 1 may be modified, or certain means may be replaced by equivalent means.

A terminal box according to the invention may, to great advantage, be used in devices such as a terminal unit. It enables the wiring of all or a part of the electronic circuits of the latter.

I claim:

1. A terminal box array comprising a pluarlity of thin generally rectangular, terminal boxes of insulating material stacked, side by side, in upstanding position, on a common support extending transversely to the longitudinal axis of the boxes, each box comprising a two part body including an open ended first portion fixed on one edge to said support and a second removable edge portion which interfits with said open end of said first body portion, a printed circuit card fixed to said second body portion and slidably received within said first body portion, and terminals carried on said printed circuit card along its peripheral edge at portions corresponding to said second removable edge portion and at least one other edge of said first body portion internally of said box and openings within the edges of both body portions and aligned respectively with said terminals to permit external access thereto.

2. The terminal box array as claimed in claim 1, wherein said terminals and the corresponding openings within said boxes are arranged in rows parallel to the support, said terminals include at least one row of first terminals, and said array is provided with a connection strip arranged along said row and connected to first terminals of respective plates.

3. The terminal box array as claimed in claim 2, wherein said first terminals comprise metal tabs folded square including a first branch fixed to the edge of one of the faces of the printed circuit cards and a second branch flush with said edge and being provided with a tapped hole, said connection strip being formed by a flat rectilinear tab provided at regular intervals with holes, and wherein each second branch is connected to said strip rectilinear tab by a screw passing through a hole and received by said tapped hole.

4. The terminal box array as claimed in claim 2, wherein said terminals include at least one row of second terminals provided with clip pins.

5. The terminal box array as claimed in claim 4, wherein said terminals include at least one row of third terminals provided with tightenable screws with said third row terminals being positioned within said second, removable body portion of said box.

6. The terminal box array as claimed in claim 1, wherein said first, fixed body portion is provided with a ridge having extensions in the shape of teeth whose direction is parallel to the longitudinal axis of the box, with said teeth forming the teeth of a spinning comb.

7. The terminal box array as claimed in claim 1, wherein the removable body portion of each box is provided with studs connecting it to said printed circuit card.

8. The terminal box array as claimed in claim 1, wherein said removable body portion of said box is connected to the fixed body portion by lug means arranged at its base which cooperate with grooves provided in the fixed body portion which lock at the end of their travel, into openings having a deformable contour provided in the wall portion of the grooves and by nipple means arranged at its top which fit into a hollow part provided within the upper part of the fixed body portion at the moment when the nipple means lock.

9. The terminal box array as claimed in claim 1, further including a warning lamp fixed on one of the edges of the printed circuit card which may be reached from the outside by means of an opening within one edge of the plate, in alignment with said lamp.

10. The terminal box array as claimed in claim 1, further including lock-nipple means on the sides of said box body to permit said boxes to be preassembled in block form prior to placing them on said support, and wherein each box is provided with a removable fixing leg permitting said body to be mounted by way of said fixing leg on said support.

* * * * *